United States Patent [19]

Brennan

[11] Patent Number: 5,629,857

[45] Date of Patent: May 13, 1997

[54] METHOD AND SYSTEM FOR INDICATING A STATUS OF A CIRCUIT DESIGN

[75] Inventor: Thomas C. Brennan, Rochester, Minn.

[73] Assignee: International Business Machines Corporation, Armonk, N.Y.

[21] Appl. No.: 339,529

[22] Filed: Nov. 15, 1994

[51] Int. Cl.⁶ .................................................. G06F 17/50
[52] U.S. Cl. ........................... 364/488; 364/489; 364/491
[58] Field of Search ..................................... 364/488, 489, 364/490, 491, 578, 521; 340/172.5; 395/162

[56] References Cited

U.S. PATENT DOCUMENTS

| | | | |
|---|---|---|---|
| 3,653,001 | 3/1972 | Ninke | 340/172.5 |
| 4,267,573 | 5/1981 | Chaikin et al. | 364/515 |
| 4,675,832 | 6/1987 | Robinson et al. | 364/521 |
| 4,813,013 | 3/1989 | Dunn | 364/900 |
| 4,896,272 | 1/1990 | Kurosawa | 364/491 |
| 4,918,614 | 4/1990 | Modarres et al. | 364/490 |
| 4,939,672 | 7/1990 | Meadows | 364/521 |
| 5,040,131 | 8/1991 | Torres | 364/521 |
| 5,043,920 | 8/1991 | Malm et al. | 364/521 |
| 5,047,970 | 9/1991 | Kamakura | 364/578 |
| 5,050,091 | 9/1991 | Rubin | 364/488 |
| 5,053,980 | 10/1991 | Kanazawa | 364/578 |
| 5,062,060 | 10/1991 | Kolnick | 364/521 |
| 5,103,499 | 4/1992 | Miner et al. | 395/162 |
| 5,146,556 | 9/1992 | Hullot et al. | 395/159 |
| 5,148,379 | 9/1992 | Konno et al. | 364/578 |
| 5,220,512 | 6/1993 | Watkins et al. | 364/489 |
| 5,251,159 | 10/1993 | Rowson | 364/578 |
| 5,325,309 | 6/1994 | Halaviati et al. | 364/488 |
| 5,359,545 | 10/1994 | Ott et al. | 364/578 |
| 5,479,355 | 12/1995 | Hyduke | 364/488 |

Primary Examiner—Kevin J. Teska
Assistant Examiner—Russell W. Frejd
Attorney, Agent, or Firm—Owen Gamon; Duke W. Yee; Andrew J. Dillon

[57] ABSTRACT

A method and data processing system for graphically indicating a status of a circuit unit displayed within a circuit design on a display within a data processing system. The circuit unit displayed within the circuit design is selected, wherein the circuit unit is located at a location and has a first status. A movement of the selected circuit unit is detected. Whether the movement of the selected circuit unit changes the status of the selected circuit unit is determined. A status change of the selected circuit unit is automatically indicating by graphically indicating the status change in response to the change of status of the selected circuit unit, wherein the status of the selected circuit unit is dynamically indicated to a user in response to a movement of the selected circuit unit.

14 Claims, 8 Drawing Sheets

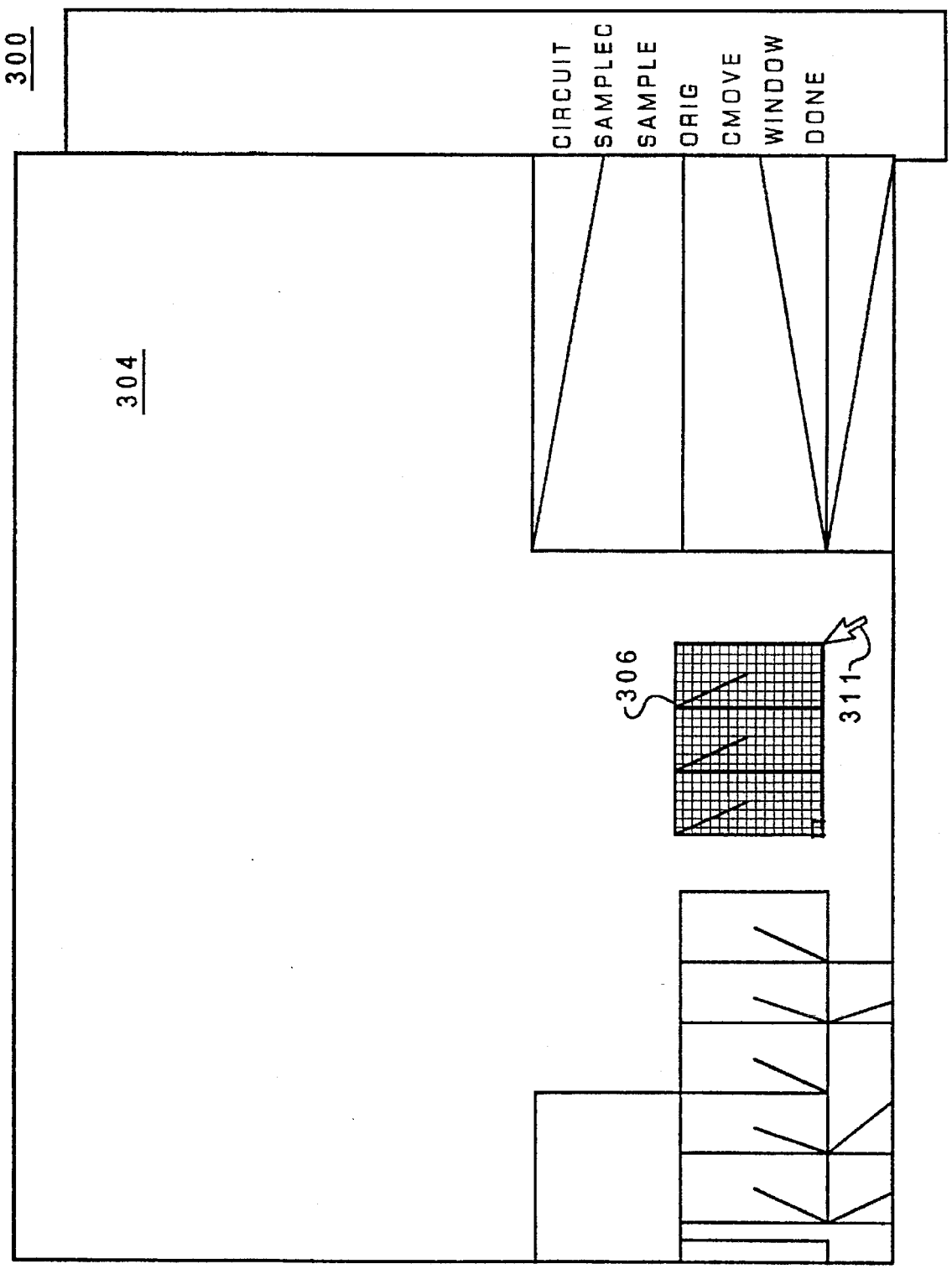

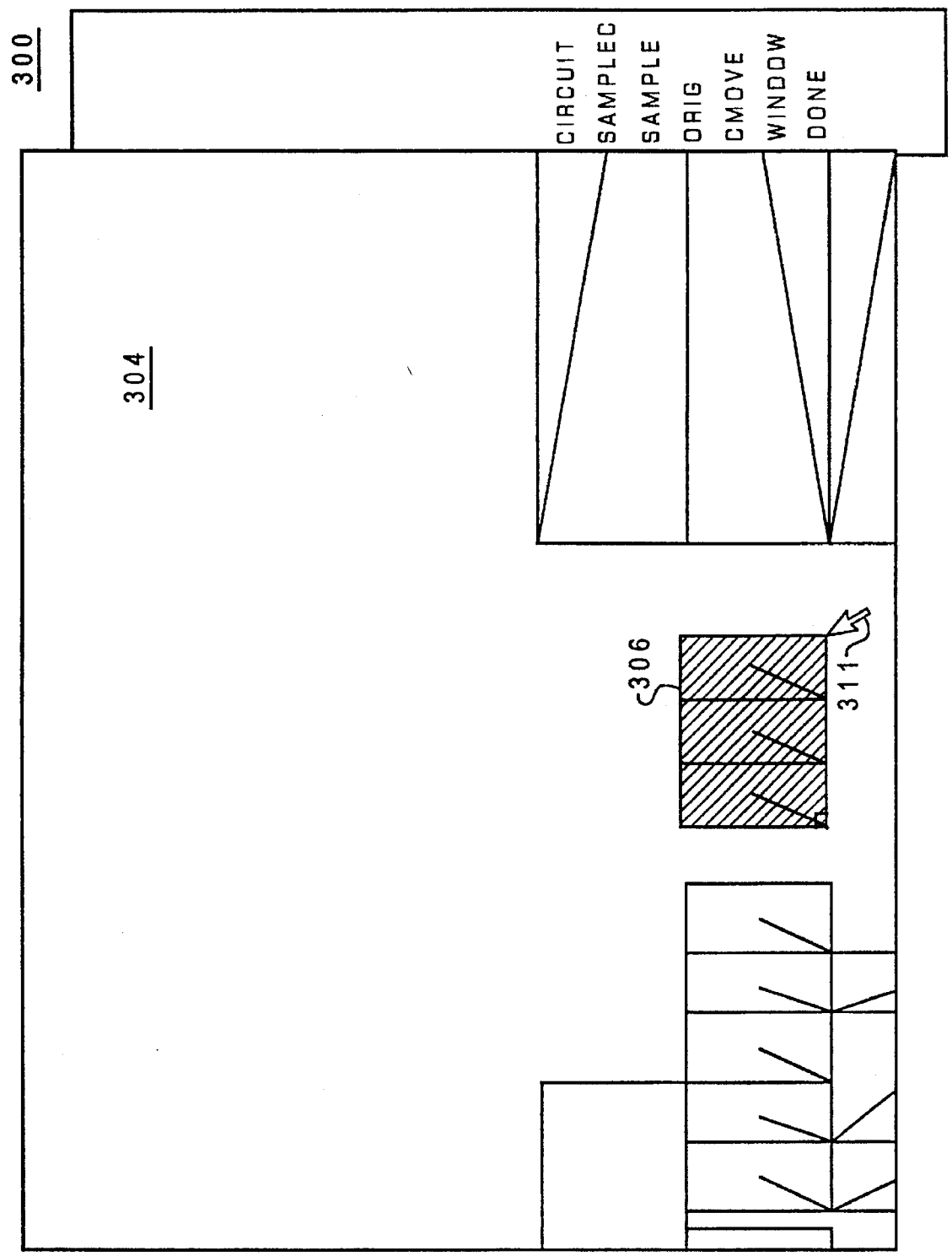

METHOD AND SYSTEM FOR INDICATING A STATUS OF A CIRCUIT DESIGN

BACKGROUND OF THE INVENTION

1. Technical Field

The present invention relates generally to an improved method and system for circuit design and in particular, to a method and system for indicating a status of a circuit within a integrated circuit layout. Still more particularly, the present invention relates to a method and system for dynamically indicating a status of a circuit within an integrated circuit layout.

2. Description of the Related Art

The manipulation of data in a data processing system is well known in the prior art. Data may be manipulated in many ways in a modern state-of- the-art data processing system: data accessing, data encoding, data communications, data compression, data conversion, data entry, data exchange, data filing, data linking, data locking, data manipulation, data modeling, data sorting, and data transferring. The large amounts of data that are available to the user of a modern state of the art data processing system often becomes overwhelming in magnitude and complexity.

As a result, graphic user interfaces have been developed to simplify the interface between a user and a data processing system. For example, in designing electronic circuits, such integrated circuit layouts, graphic user interfaces have been employed to aid a user in developing an integrated circuit. Often times, a designer moving or altering circuits within an integrated circuit layout is unable to determine whether the present location of a selected circuit or group of circuits is correct in its present location. The correctness or legality of circuits within an integrated circuit layout are determined when a simulation is run on the integrated circuit layout. In such systems, the designer is unable to determine whether the new location of a circuit or group of circuits is correct until the simulation is run after the circuit or circuits have been placed in a new location. Therefore, it would be advantageous to have a method and system for indicating a status of a circuit or group of circuits within a circuit designs, such as an integrated circuit layout, without requiring a simulation of the design to be executed after placing the circuit or circuits in a new location.

SUMMARY OF THE INVENTION

It is one object of the present invention to provide an improved method and system for circuit design.

It is another object of the present invention to provide a method and system for indicating a status of a circuit within a integrated circuit layout.

It is yet another object of the present invention to provide a method and system for dynamically indicating a status of a circuit within an integrated circuit layout.

The present invention provides method and data processing system for graphically indicating a status of a circuit unit displayed within a circuit design on a display within a data processing system. The circuit unit displayed within the circuit design is selected, wherein the circuit unit is located at a location and has a first status. A movement of the selected circuit unit is detected. Whether the movement of the selected circuit unit changes the status of the selected circuit unit is determined. A status change of the selected circuit unit is automatically indicating by graphically indicating the status change in response to the change of status of the selected circuit unit, wherein the status of the selected circuit unit is dynamically indicated to a user in response to a movement of the selected circuit unit.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIGS. 3A–3E depict the dynamic indication of the status of the circuit based on movement of a circuit unit within the circuit design.

DETAILED DESCRIPTION OF PREFERRED EMBODIMENT

Figure 1:
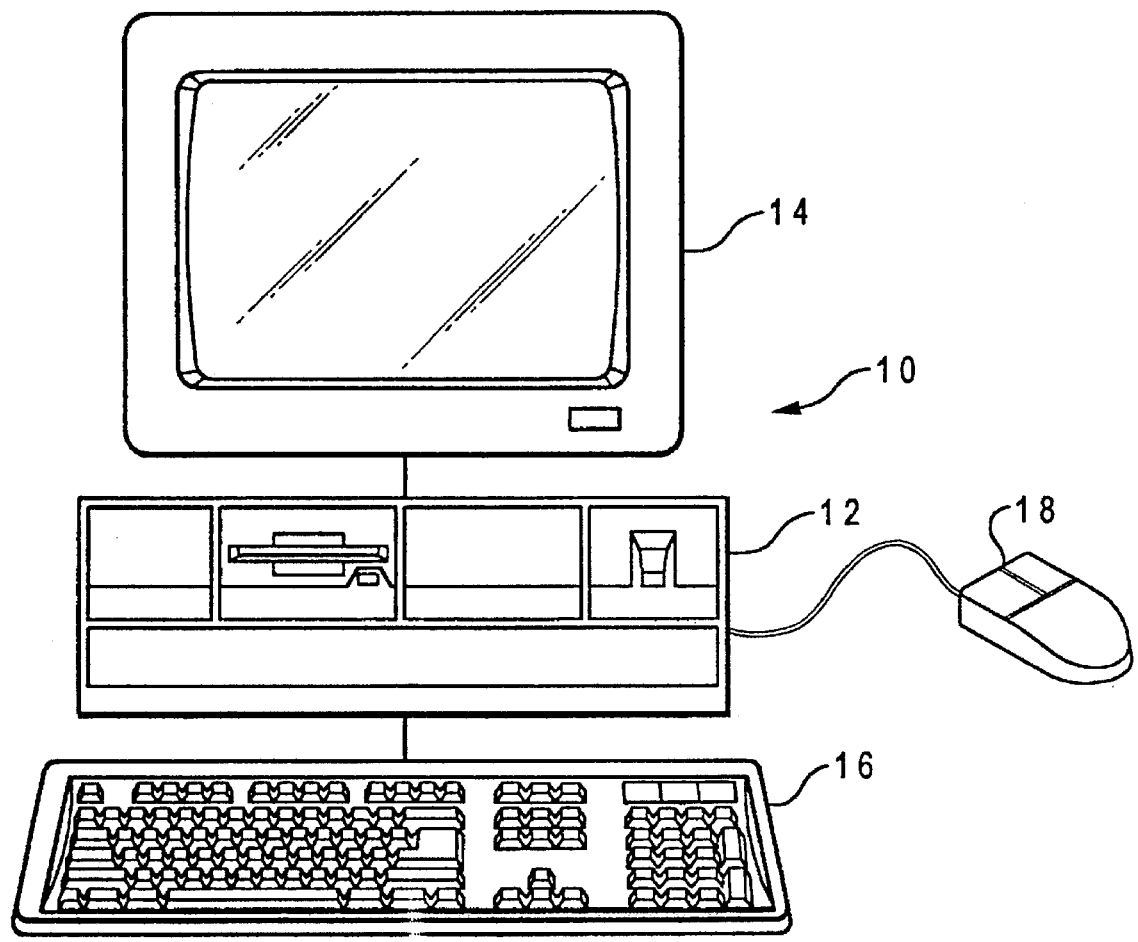
FIG. 1 depicts a data processing system in the form of a personal computer in which the present invention can be employed.

With reference now to the figures and in particular with reference to FIG. 1, a data processing system, personal computer system 10, in which the present invention can be employed is depicted. As shown, personal computer system 10 comprises a number of components, which are interconnected together. More particularly, a system unit 12 is coupled to and can drive an optional monitor 14 (such as a conventional video display). A system unit 12 also can be optionally coupled to input devices such as a PC keyboard 16 or a mouse 18. Mouse 18 includes right and left buttons (not shown). The left button is generally employed as the main selector button and alternatively is referred to as the first mouse button or mouse button 1. The right button is typically employed to select auxiliary functions as explained later. The right mouse button is alternatively referred to as the second mouse button or mouse button 2. An optional output device, such as a printer 20, also can be connected to the system unit 12. Finally, system unit 12 may include one or more mass storage devices such as the diskette drive 22.

As will be described below, the system unit 12 responds to input devices, such as PC keyboard 16, the mouse 18, or local area networking interfaces. Additionally, input/output (I/O) devices, such as floppy diskette drive 22, display 14, printer 20, and local area network communication system are connected to system unit 12 in a manner well known. Of course, those skilled in the art are aware that other conventional components also can be connected to the system unit 12 for interaction therewith. In accordance with the present invention, personal computer system 10 includes a system processor that is interconnected to a random access memory (RAM), a read only memory (ROM), and a plurality of I/O devices.

In normal use, personal computer system 10 can be designed to give independent computing power to a small group of users as a server or a single user and is inexpensively priced for purchase by individuals or small businesses. In operation, the system processor functions under an operating system, such as IBM's OS/2 operating system or DOS. OS/2 is a registered trademark of International Business Machines Corporation. This type of operating system includes a Basic Input/Output System (BIOS) interface between the I/O devices and the operating system. BIOS, which can be stored in a ROM on a motherboard or planar, includes diagnostic routines which are contained in a power on self test section referred to as POST.

Figure 2:
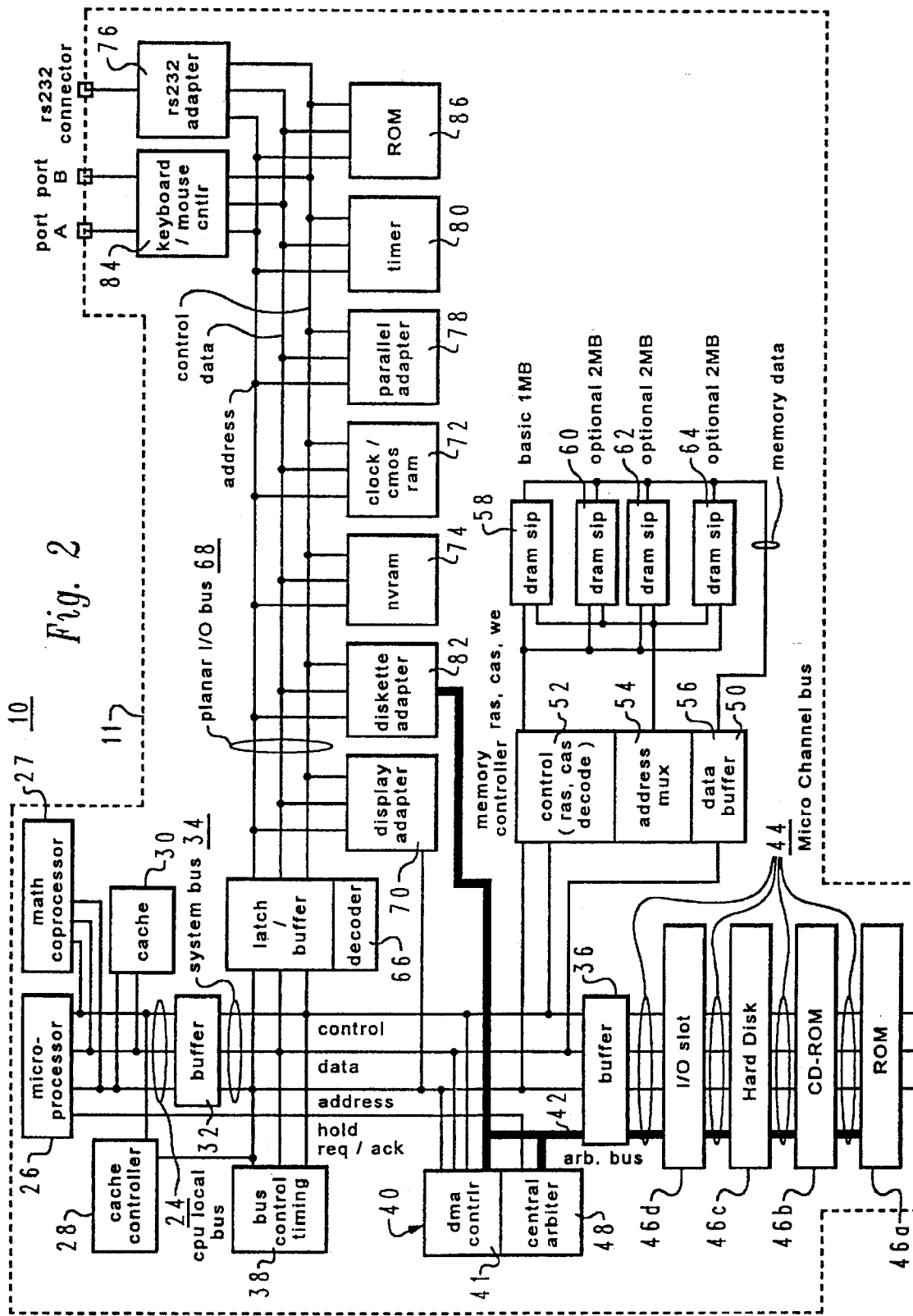
FIG. 2 is a block diagram of a personal computer system illustrating the various components of personal computer system in accordance with the present invention.

Prior to relating the above structure to the present invention, a summary of the operation in general of personal computer system 10 may merit review. Referring to FIG. 2, there is shown a block diagram of personal computer system 10 illustrating the various components of personal computer system 10 in accordance with the present invention. FIG. 2 further illustrates components of planar 11 and the connection of planar 11 to I/O slots 46a–46d and other hardware of personal computer system 10. Connected to planar 11 is the system central processing unit (CPU) 26 comprised of a microprocessor which is connected by a high speed CPU local bus 24 through a bus controlled timing unit 38 to a memory control unit 50 which is further connected to a volatile random access memory (RAM) 58. While any appropriate microprocessor can be used for CPU 26, one suitable microprocessor is the Pentium microprocessor, which is sold by Intel Corporation. "Pentium" is a trademark of Intel Corporation.

While the present invention is described hereinafter with particular reference to the system block diagram of FIG. 2, it is to be understood at the outset of the description which follows, it is contemplated that the apparatus and methods in accordance with the present invention may be used with other hardware configurations of the planar board. For example, the system processor could be an Intel 80286, 80386, or 80486 microprocessor. These particular microprocessors can operate in a real addressing mode or a protected addressing mode. Each mode provides an addressing scheme for accessing different areas of the microprocessor's memory.

Returning now to FIG. 2, CPU local bus 24 (comprising data, address and control components) provides for the connection of CPU 26, an optional math coprocessor 27, a cache controller 28, and a cache memory 30. Also coupled on CPU local bus 24 is a buffer 32. Buffer 32 is itself connected to a slower speed (compared to the CPU local bus) system bus 34, also comprising address, data and control components. System bus 34 extends between buffer 32 and a further buffer 36. System bus 34 is further connected to a bus control and timing unit 38 and a Direct Memory Access (DMA) unit 40. DMA unit 40 is comprised of a central arbitration unit 48 and a DMA controller 41. Buffer 36 provides an interface between the system bus 34 and an optional feature bus such as the Micro Channel bus 44. "Micro Channel" is a registered trademark of International Business Machines Corporation. Connected to bus 44 are a plurality of I/O slots 46a–46d for receiving Micro Channel adapter cards which may be further connected to an I/O device or memory. In the depicted example, I/O slot 46a has a hard disk drive connected to it; I/O slot 46b has a CD-ROM drive connected to it; and I/O slot 46c has a ROM on an adapter card connected to it. Other devices, such as a modem may be connected to an I/O slot. An arbitration control bus 42 couples the DMA controller 41 and central arbitration unit 48 to I/O slots 46 and diskette adapter 82. Also connected to system bus 34 is a memory control unit 50 which is comprised of a memory controller 52, an address multiplexer 54, and a data buffer 56. Memory control unit 50 is further connected to a random access memory as represented by RAM module 58. Memory controller 52 includes the logic for mapping addresses to and from CPU 26 to particular areas of RAM 58. While the personal computer system 10 is shown with a basic 1 megabyte RAM module, it is understood that additional memory can be interconnected as represented in FIG. 2 by the optional memory modules 60 through 64.

A further buffer 66 is coupled between system bus 34 and a planar I/O bus 68. Planar I/O bus 68 includes address, data, and control components respectively. Coupled along planar bus 68 are a variety of I/O adapters and other peripheral components such as display adapter 70 (which is used to drive an optional display 14), a clock 72, nonvolatile RAM 74 (hereinafter referred to as "NVRAM"), a RS232 adapter 76, a parallel adapter 78, a plurality of timers 80, a diskette adapter 82, a PC keyboard/mouse controller 84, and a read only memory (ROM) 86. The ROM 86 includes BIOS which provides the user transparent communications between many I/O devices.

Clock 72 is used for time of day calculations. NVRAM 74 is used to store system configuration data. That is, the NVRAM will contain values which describe the present configuration of the system. For example, NVRAM 74 contains information which describe the capacity of a fixed disk or diskette, the type of display, the amount of memory, etc. Of particular importance, NVRAM 74 will contain data which is used to describe the system console configuration; i.e., whether a PC keyboard is connected to the keyboard/mouse controller 84, a display controller is available or the ASCII terminal is connected to RS232 adapter 76. Furthermore, these data are stored in NVRAM 74 whenever a special configuration program is executed. The purpose of the configuration program is to store values characterizing the configuration of this system to NVRAM 76 which are saved when power is removed from the system.

Connected to keyboard/mouse controller 84 are ports A and B. These ports are used to connect a PC keyboard (as opposed to an ASCII terminal) and mouse to the PC system. Coupled to RS232 adapter unit 76 is an RS232 connector. An optional ASCII terminal can be coupled to the system through this connector.

Specifically, personal computer system 10 may be implemented utilizing any suitable computer such as the IBM PS/2 computer or an IBM RISC SYSTEM/6000 computer, both products of International Business Machines Corporation, located in Armonk, N.Y. "RISC SYSTEM/6000" is a trademark of International Business Machines Corporation and "PS/2" is a registered trademark of International Business Machines Corporation.

The processes depicted in FIGS. 3A–3E and 4 may be implemented by those of ordinary skill in the art within the data processing system depicted in FIGS. 1 and 2. The processes of the present invention also may be implemented in a program storage device that is readable by a data processing system, wherein the program storage device encodes data processing system executable instructions coding for the processes of the present invention. The program storage device may take various forms including, for example, but not limited to a hard disk drive, a floppy disk, an optical disk, a ROM, and an EPROM, which are known to those skilled in the art. The processes stored on a program storage device are dormant until activated by using the program storage device with the data processing system. For example, a hard drive containing data processing system executable instructions for the present invention may be connected to a data processing system; a floppy disk containing data processing system executable instructions for the present invention may be inserted into a floppy disk drive in the data processing system; or a ROM containing data processing system executable instructions for the present invention may be connected to the data processing system via a card or adapter connected to an I/O slot.

Figure 3A:
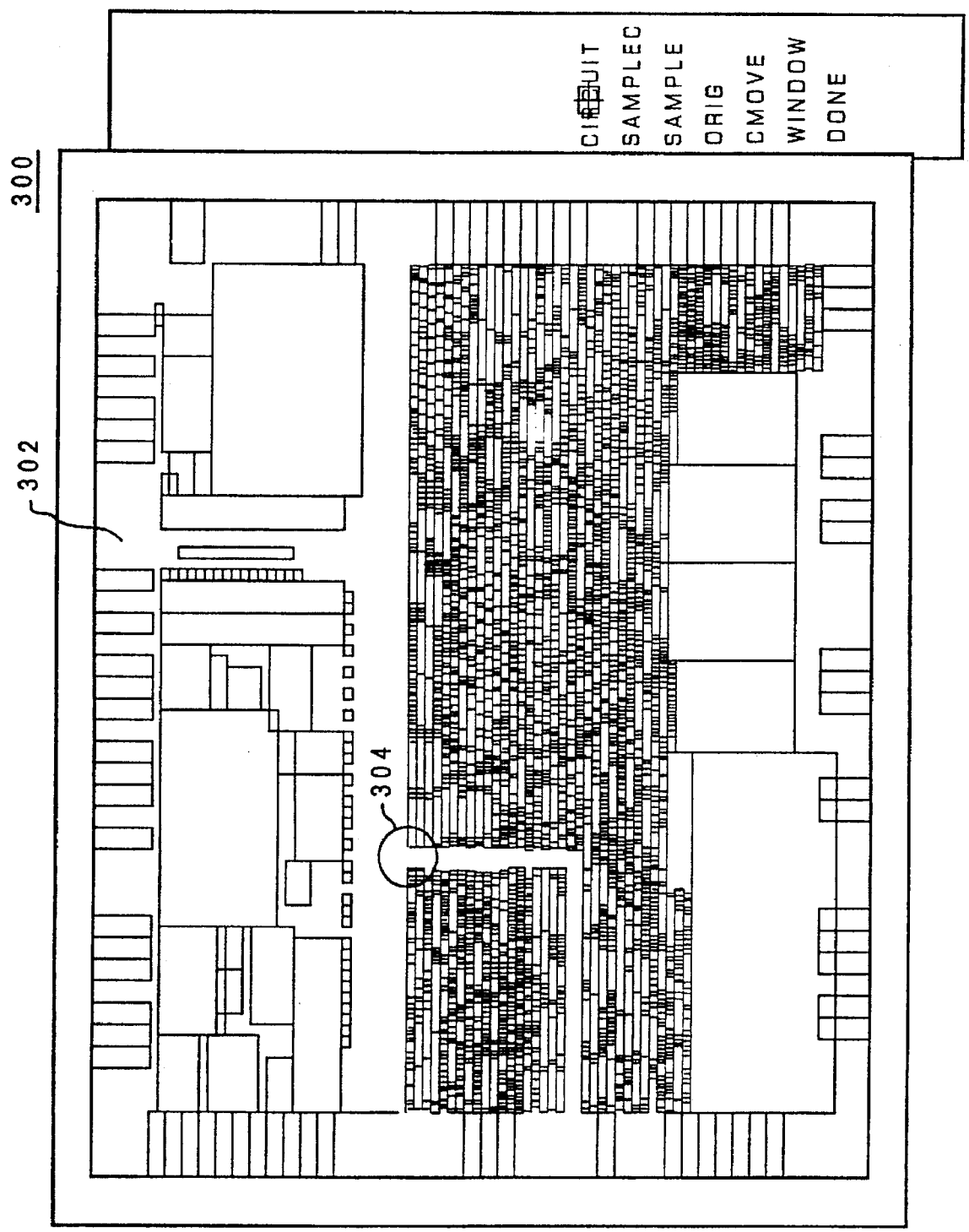
Figure 3B:
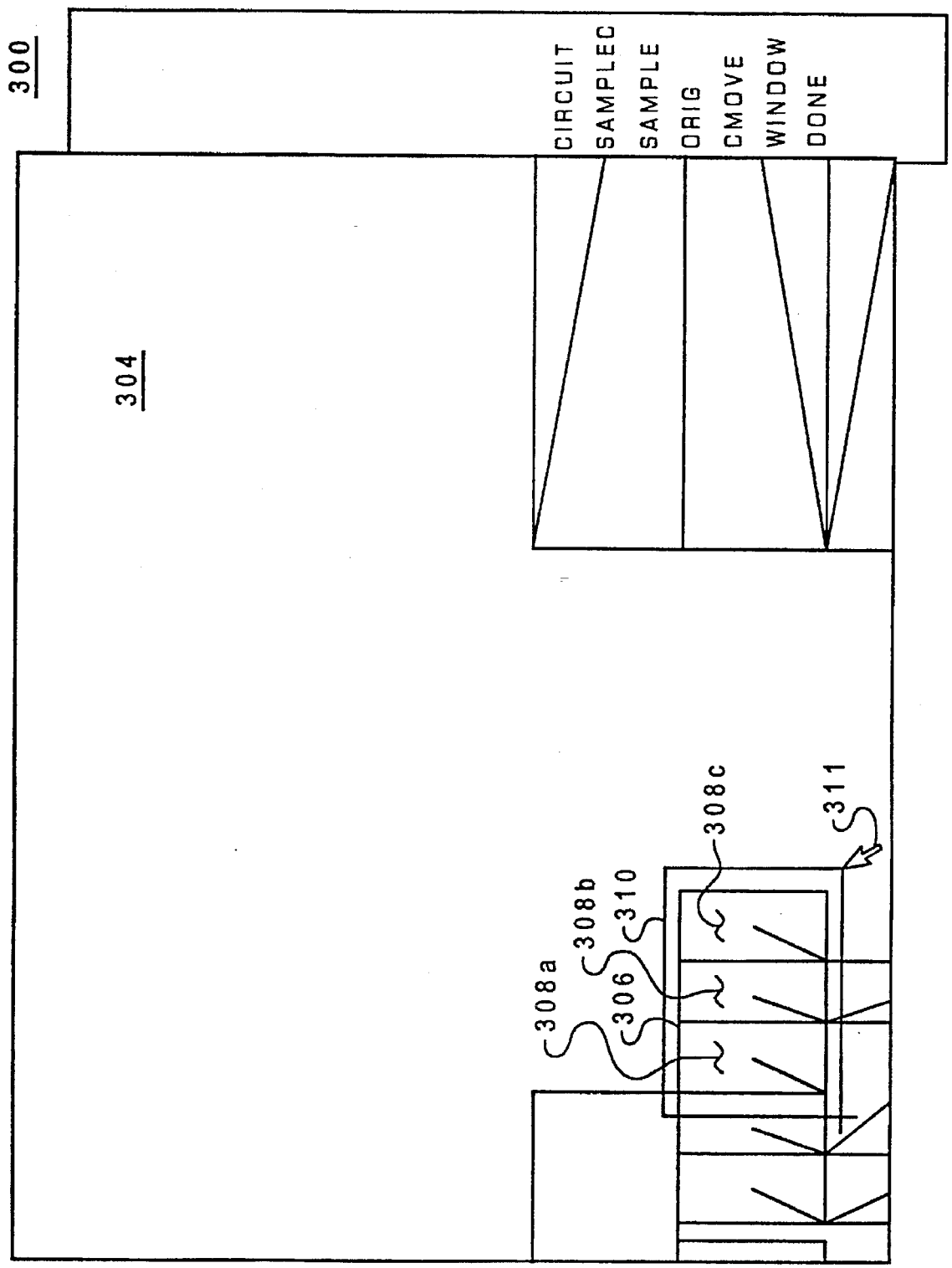

The present invention provides a method and system for dynamically indicating the status of a circuit by a color that indicates the status of the circuit at a new location. FIGS. 3A–3E depict the dynamic indication of the status of a circuit unit based on movement of the circuit unit within the circuit design in accordance with a preferred embodiment of the present invention. With reference to FIG. 3A, a display 300 of circuit design 302 is depicted in accordance with a preferred embodiment of the present invention. Circuit design 302 is a integrated circuit layout having a number of circuit units. A "circuit unit" is a grouping that includes one or more circuits. In the depicted example, a user has selected section 304 as a section for editing within circuit design 302. FIG. 3B illustrates an enlarged view of section 304 within screen 300. As can be seen in FIG. 3B, circuit unit 306, which includes circuits 308a–308c have been selected for movement. A user typically selects a circuit unit by bounding the selected circuits with a box 310, which is defined using a pointer 311 in accordance with a preferred embodiment of the present invention.

Pointer 311 is an ionic image controlled by a mouse or other such device, and is displayed on a video display device of a data processing system to visual indicate to the user icons, menus, or the like that may be manipulated or selected. The term "mouse", when utilized in this document, refers to any type of operating supported graphical pointing device, including but not limited to: a mouse, track ball; light pen; touch screen; and the like. A pointing device is typically employed by a user of a data processing system to interact with the data processing system's graphic user interface.

Figure 3C:
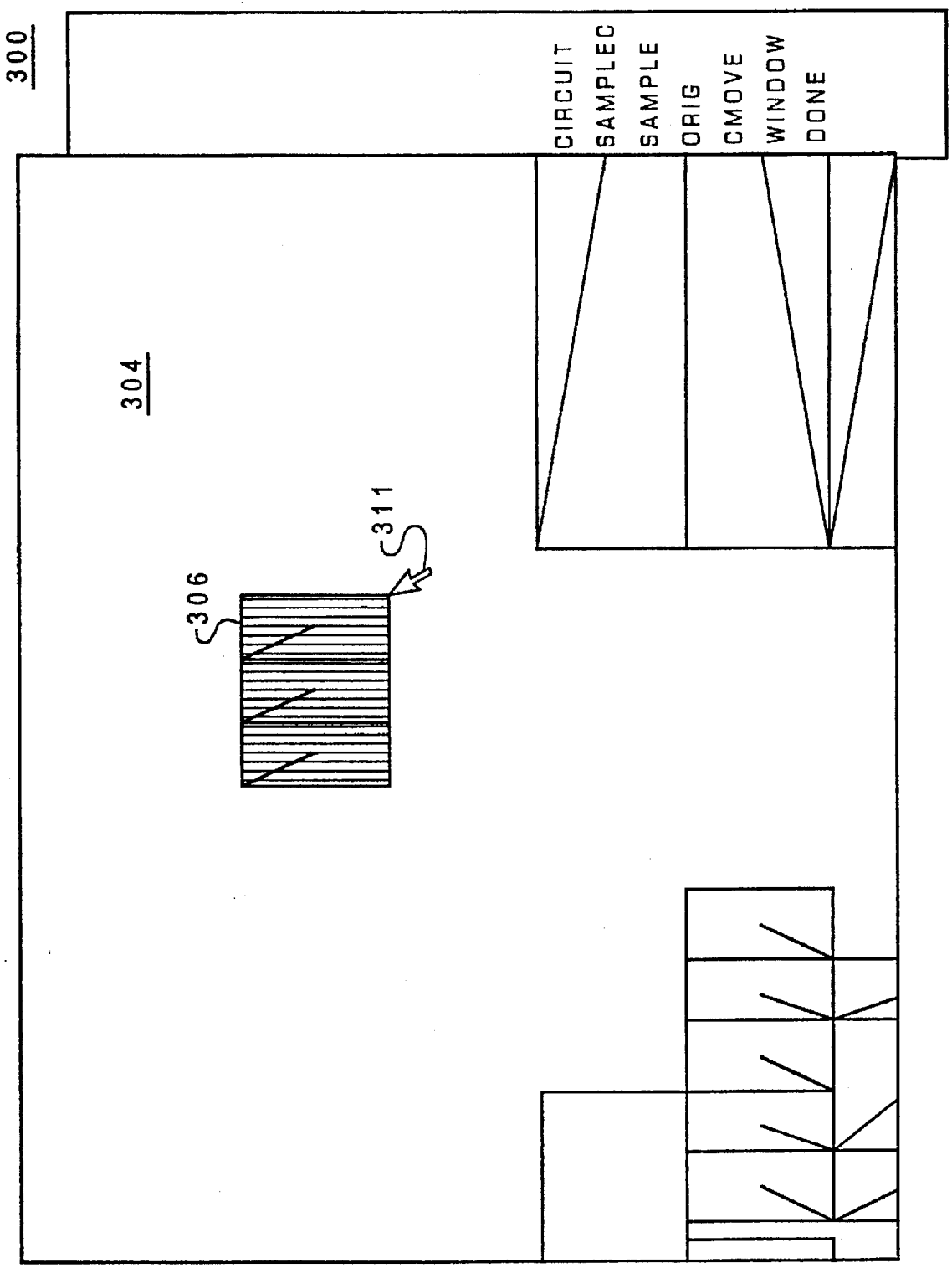

Referring next to FIG. 3C, circuit unit 306 has been moved from its original position to a new location using pointer 311. In its new position, circuit unit 306 is in an illegal or incorrect position, meaning that circuit unit 306 cannot be placed in this position. In accordance with a preferred embodiment of the present invention, such a condition is graphically indicated to the user by displaying circuit unit 306 in the color red. In FIG. 3D, circuit unit 306 is depicted in the color yellow because circuit unit 306 is in a correct or legal position, but has an orientation that is different from the original. Such information is important if one is assuming certain wiring patterns, which is common in custom chip physical design.

In FIG. 3E, circuit unit 306 is displayed in the color green because the position is legal or correct and has the same orientation the original. In such a situation, the user may simply press a button or release a depressed button on a mouse to place the circuit unit in the location.

The status of the circuit is dynamically displayed and the color changes as the user moves the circuit unit. Thus, if all of the circuits are red, the user may continue to look for an appropriate location by dragging the circuit unit over other portions of the circuit design.

Although the depicted embodiment employs the colors: green, yellow and red, other colors may be employed to depict the status of the circuit unit as the circuit unit is moved within the circuit design. In addition, other graphical indications may be employed to indicate the status of circuit. Furthermore, audible indications could be employed in place or in addition to the graphical indications of the circuit unit status.

Figure 4:
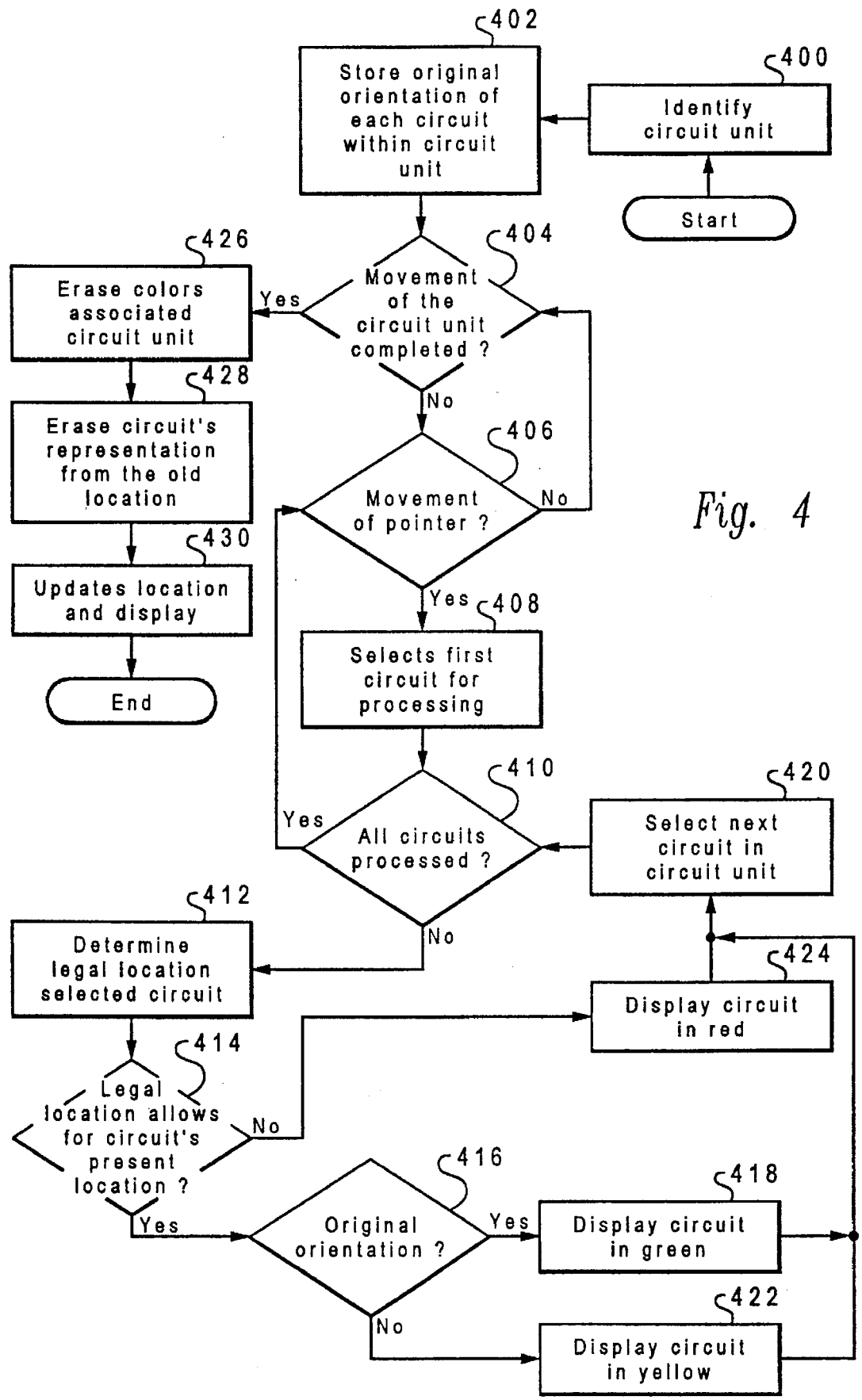
FIG. 4 depicts a flowchart of a process to dynamically indicate the status of a circuit unit in accordance with a preferred embodiment of the present invention.

With reference next to FIG. 4, a flowchart of a process to dynamically indicate the status of a circuit unit is depicted in accordance with a preferred embodiment of the present invention. The process begins by identifying a cluster of circuits for processing by enclosing the cluster of circuits in a rectangle to identify a circuit unit (step 400). The process then stores the original orientation of each circuit located within the circuit unit (step 402). A determination of whether a mouse button has been pushed to indicate that a movement of the circuit unit has been completed is made (step 404). If the movement is not completed, a determination of whether movement of a pointer associated with the mouse has occurred (step 406). If the pointer has moved, the process then selects the first circuit in the circuit for processing (step 408).

Thereafter, a determination of whether all circuits in the circuit unit have been processed is made (step 410). If not, all of the circuits in the circuit unit have been processed, identification of the legal location of the selected circuit is made (step 412). Next, a determination of whether the legal location allows for this circuit's present location (step 414). If the legal location allows for this circuit's present location, the process then determines whether the legal location allows for the original orientation of the circuit (step 416). If the legal location allows for the original orientation, the process then displays the circuit at this location in the color green (step 418).

The process then points to the next circuit in the circuit unit (step 420). Thereafter, the process returns to step 410. Referring back to step 416, if the legal location does not allow for the original orientation, the process then displays the circuit at this location in the color yellow (step 422), Thereafter, the process proceeds to block 420 as previously described.

Referring again to step 414, if the legal location does not allow for this circuit, the process displays the circuit at this location in the color red (step 424). Thereafter, the process points to the next circuit in the circuit unit as described in step 420. Referring again to step 410, if all circuits in the circuit unit have been processed, the process then returns to step 406 to determine whether the pointer has moved. With reference again to step 406, if the pointer has not moved, the process then returns to step 404 to determine whether the mouse button has been pushed to indicate that the movement of the circuit unit has been completed. If the movement has been completed, the process then proceeds to erase the colors associated with the circuit unit movement (step 426). Thereafter, the process erases the circuit's representation from the old location (step 428) and updates the location and display for circuits within the circuit unit (step 430). The process thereafter terminates.

The determination of the legal location of a circuit and its orientation may be performed using well known circuit simulation programs in accordance with a preferred embodiment of the present invention. Chip Edit, a product of International Business Machines Corporation, is one such circuit simulation-program that could be used In accordance with a preferred embodiment of the present invention. The Indication of the legal or correct position of a circuit is merely used as a input into the processes of the present invention to provide a dynamic indication of the status of circuits within a circuit unit.

While the invention has been particularly shown and described with reference to a preferred embodiment, it will be understood by those skilled in the art that various changes in form and detail may be made therein without departing from the spirit and scope of the invention.

What is claimed is:

1. A method in a data processing system for graphically indicating a status of a circuit unit displayed within a circuit design on a display within the data processing system, the method comprising:

selecting the circuit unit displayed within the circuit design, wherein the circuit unit is located at a location and has a first status;

detecting a movement of the selected circuit unit;

determining whether the movement of the selected circuit unit changes the status of the selected circuit unit; and automatically indicating a status change of the selected circuit unit by graphically indicating the status change in response to the change of status of the selected circuit unit, wherein the status of the selected circuit unit is dynamically indicated to a user in response to a movement of the selected circuit unit.

2. The method of claim 1, wherein the step of automatically indicating a status change of the selected circuit unit comprises altering a color of the circuit unit.

3. The method of claim 2, wherein the step of altering a color of the circuit unit comprises displaying the circuit unit in red if the circuit unit's location is incorrect.

4. The method of claim 2, wherein the step of altering a color of the circuit unit comprises displaying the circuit unit in green if the circuit unit's location is correct.

5. The method of claim 2, where in the step of altering a color of the circuit unit comprises displaying the circuit unit in yellow if the location of the circuit unit is correct, but the orientation of the circuit unit is different from an original orientation of the circuit unit.

6. A data processing system for graphically indicating a status of a circuit unit displayed within a circuit design on a display within the data processing system, the data processing system comprising:

selection means for selecting the circuit unit displayed within the circuit design, wherein the circuit unit is located at a location and has a first status;

detection means for detecting a movement of the selected circuit unit;

determination means for determining whether the movement of the selected circuit unit changes the status of the selected circuit unit; and indication means for automatically indicating a status change of the selected circuit unit by graphically indicating the status change in response to the change of status of the selected circuit unit, wherein the status of the selected circuit unit is dynamically indicated to a user in response to a movement of the selected circuit unit.

7. The data processing system of claim 6, wherein the indication means comprises means for altering a color of the circuit unit.

8. The data processing system of claim 7, wherein the means for altering a color of the circuit unit comprises means for displaying the circuit unit in red if the circuit unit's location is incorrect.

9. The data processing system of claim 7, wherein the means for altering a color of the circuit unit comprises means for displaying the circuit unit in green if the circuit unit's location is correct.

10. The data processing system of claim 7, where in the means for altering a color of the circuit unit comprises means for displaying the circuit unit in yellow if the location of the circuit unit is correct, but the orientation of the circuit unit is different from an original orientation of the circuit unit.

11. A storage device readable by data processing system and encoding data processing system executable instructions for the data storage device comprising:

selection means for selecting a circuit unit displayed within a circuit design, wherein the circuit unit is located at a location and has a first status;

detection means for detecting a movement of the selected circuit unit;

determination means for determining whether the movement of the selected circuit unit changes the status of the selected circuit unit; and indication means for automatically indicating a status change of the selected circuit unit by graphically indicating the status change in response to the change of status of the selected circuit unit, wherein the status of the selected circuit unit is dynamically indicated to a user in response to a movement of the selected circuit unit and wherein the means are activated when the storage device is connected to and accessed by a data processing system.

12. The storage device of claim 11, wherein the storage device is a hard disk drive.

13. The storage device of claim 11, wherein the storage device is a ROM for use within the data processing system.

14. The storage device of claim 11, wherein the storage device is a floppy diskette.

* * * * *